(12) United States Patent
Hu et al.

(10) Patent No.: US 8,606,111 B2
(45) Date of Patent: Dec. 10, 2013

(54) METHOD, CIRCUITRY AND APPARATUS FOR OUTPUTTING A STABLE OPTICAL SIGNAL IN A DENSE WAVELENGTH DIVISION MULTIPLEXING DEVICE DURING FAST CHANGES OF OPERATING CONDITIONS

(75) Inventors: Zhaoyang Hu, Westlake Village, CA (US); Hucheng Li, Chengdu (CN); Anbin Wang, Chengdu (CN); Meiling Lu, Chengdu (CN)

(73) Assignee: Source Photonics, Inc., Chatsworth, CA (US)

( * ) Notice: Subject to any disclaimer, the term of this patent is extended or adjusted under 35 U.S.C. 154(b) by 223 days.

(21) Appl. No.: 13/020,740

(22) Filed: Feb. 3, 2011

(65) Prior Publication Data

US 2012/0063782 A1    Mar. 15, 2012

(30) Foreign Application Priority Data

Sep. 15, 2010  (CN) .......................... 2010 1 0281729

(51) Int. Cl.
*H01S 3/10*  (2006.01)
(52) U.S. Cl.
USPC ......................................................... 398/136
(58) Field of Classification Search
USPC ................... 398/5, 93; 372/29.02, 34
See application file for complete search history.

(56) References Cited

U.S. PATENT DOCUMENTS

| | | | | |
|---|---|---|---|---|
| 4,985,896 | A * | 1/1991 | Kimizuka et al. | 372/38.02 |
| 6,580,531 | B1 * | 6/2003 | Swanson et al. | 398/5 |
| 7,183,540 | B2 | 2/2007 | Zhang et al. | |
| 7,200,336 | B2 | 4/2007 | Yu et al. | |
| 7,269,191 | B2 * | 9/2007 | Stewart et al. | 372/34 |
| 7,650,077 | B2 | 1/2010 | Yu et al. | |
| 7,733,929 | B2 * | 6/2010 | Sasada et al. | 372/29.02 |

FOREIGN PATENT DOCUMENTS

CN    101592762 A    12/2009
CN    201413415 Y    2/2010

OTHER PUBLICATIONS

Zhaoyang Hu, Qing Xiao, Meiling Lu, Yan Chen and Thomas Liljeberg; "Tunable Dense Wavelength Division Multiplexing Transceiver, Circuits and Devices Therefor, and Methods for Making and Using Such Transceivers, Circuits and Devices"; U.S. Appl. No. 13/050,787, filed Mar. 17, 2011.
Office Action dated Jul. 16, 2012; Chinese Patent Application No. 201010281729.2; 4 pages; The State Intellectual Property Office of the P.R.C., The People's Republic of China.

(Continued)

*Primary Examiner* — Danny Leung
(74) *Attorney, Agent, or Firm* — Murabito, Hao & Barnes LLP; Andrew D. Fortney

(57) ABSTRACT

The disclosure relates to a fast, stable method of output wavelength control in a DWDM optical device, and a circuit configured to perform the method. The method and circuit can control timing and overshoot during conditions of rapid operational changes, such as during power-on or restart of the device. The method and circuit includes optimized APC, TEC and electro-absorption (EA) modulator control hardware and algorithms, to effectively control transient processes. Software and circuitry based on the method(s) are achieved in part by optimizing APC, EA and TEC control algorithms. In combination with hardware/circuit optimization, one can achieve fast turn-on of an optical output signal at a stable wavelength. The method and circuit provides a stable power-up process in which a change of wavelength is small enough to meet DWDM specification requirements, to ensure the elimination and avoidance of crosstalk in adjacent channels in dense wave (sub)systems.

19 Claims, 5 Drawing Sheets

(56) References Cited

OTHER PUBLICATIONS

Huang Huachang, Hu Feng and Lu Guanghui; "DWDM SFD with Controllable Wavelength"; Patent Abstracts of China; Chinese Publication No. CN201413415 (Y); Publication Date: Feb. 24, 2010; Espacenet Database—Worldwide; http://worldwide.espacenet.com/.

Cao Jianguang; "Optical Module and Control Method Thereof"; Patent Abstracts of China; Chinese Publication No. CN101592762 (A); Publication Date: Dec. 2, 2009; Espacenet Database—Worldwide; http://worldwide.espacenet.com/.

* cited by examiner

METHOD, CIRCUITRY AND APPARATUS FOR OUTPUTTING A STABLE OPTICAL SIGNAL IN A DENSE WAVELENGTH DIVISION MULTIPLEXING DEVICE DURING FAST CHANGES OF OPERATING CONDITIONS

CROSS REFERENCE TO RELATED APPLICATION

This application claims the benefit of Chinese Patent Application No. 201010281729.2, filed on Sep. 15, 2010, which is hereby incorporated by reference as if fully set forth herein.

FIELD OF THE INVENTION

The present invention generally relates to the field of optical communication networks. More specifically, embodiments of the present invention pertain to methods, algorithms, circuitry and apparatuses for fast and stable turn-on in a dense wavelength division multiplexing (DWDM) optical transceiver.

DISCUSSION OF THE BACKGROUND

With wavelength division multiplexing (WDM) technology and erbium-doped fiber amplifiers (EDFA), optical networks have demonstrated with large bandwidth and high-speed transmission on fiber media, and have been able to transport tens of Tbit/s of optical information over a single fiber. State-of-the-art optical communication systems have widely implemented a large number of DWDM systems in their backbone optical network, to try to meet a huge demand for video, image, gaming and instantaneous communications.

Furthermore, in order to more effectively utilize spectral efficiency and fiber-optic bandwidth in an optical transmission system, more and more carriers are starting to apply 40 Gb/s and corresponding 100 Gb/s optical dense wave transmission products. These attempts can not only enhance the routing efficiency, but can also significantly increase the existing capacity of optical communication systems. Based on these unique benefits, and due to the high demand from service providers, equipment and component manufacturers are putting more and more investment and resources into developing DWDM products.

However, with the dramatic increase in the volume of traffic, the wavelength spacing interval between multiple channels becomes smaller and smaller. As a result, nonlinear physics effects can cause crosstalk between channels, thereby reducing signal quality and affecting the transmission distance. There are some existing technologies which can be used to avoid or suppress the crosstalk between adjacent channels. However, during the power up or transient on/off switching process, it may be difficult to suppress completely the crosstalk between channels, especially in high speed and large bandwidth applications, such as 10 Gb/s DWDM XFP (10 Gigabit Small Form Factor Pluggable) optical transceivers and beyond. Those optical transceivers use a cooled Electro-absorption Modulation Laser (EML) to achieve higher speed and longer transmission distances. Due to the fundamental physics of semiconductor lasers, wavelength drift cannot be eliminated during a transient process. Currently, some optical transceivers include an optical switch or similar device to maintain an OFF status for the optical output until the wavelength reaches a target range, but adding an optical switch or similar device greatly increases the cost of the transceiver, and limits their applications. Considering the trend towards lower cost and smaller size for the optical transceivers, these solutions do not appear to be commercially feasible.

FIG. 1 shows a block diagram of a 10 Gb/s DWDM XFP optical module 100, in which a microprocessor (MCU) 120, through a TEC control circuit 130, adjusts and controls a cooled DWDM EML transmitter optical sub assembly (TOSA) 110 that outputs optical data ODOUT according to one or more International Telecommunication Union (ITU) standards. However, conventional TEC control circuit 130 and APC control circuit 140 may cause the DWDM XFP optical module 100 to fail to meet wavelength behavior requirements such as turn-on time in DWDM applications.

DWDM XFP optical module 100 also includes an EML TOSA 110, which includes a distribution grating laser diode [DFB-LD] 115 and an electroabsorption modulator [EA] 112. The transmitter portion of optical module 100 includes an EA modulation control block 150 that adjusts a bias voltage for the operating point of the EA 112, and an EML control circuit 160 that receives data from the electrical interface 180 (e.g., EDIN or a modified version thereof), through a Bias-tee circuit 165 to be applied to the EML TOSA 110. The receiver portion of optical module 100 includes a receiver optical sub assembly (ROSA) 170 that includes a photodiode PD 172 and a transimpedance amplifier [TIA] 174, configured to receive optical data ODIN from the optical network and provide an electrical signal to the electrical interface 180 (which outputs electrical data EDOUT to an electrical device or network component).

FIG. 2 is a graph of the power of as a function of wavelength for a typical transient signal during the power up process in a conventional DWDM XFP optical module. FIG. 2 shows the wavelength drift is more than 0.4 nm. However, per the ITU 100 GHz/50 GHz dense wavelength division standard, the corresponding channel spacing is only about 0.8 nm or 0.4 nm, respectively. As a result, severe crosstalk between adjacent channels occurs when using a traditional temperature control circuit (TEC) and automatic optical power control circuit (APC), leading to significant degradation of signal quality in DWDM networks.

SUMMARY OF THE INVENTION

Embodiments of the present invention relate to methods, algorithms, circuits and apparatuses for generating an output signal and controlling overshoot in a dense wavelength division multiplexing (DWDM) device. The method generally comprises providing a bias current to a laser in the DWDM device; controlling the bias current to the laser to reduce, prevent or eliminate an overshoot condition during power-up of the laser or the DWDM device; and optimizing an automatic power control (APC) loop, a thermoelectric control (TEC) loop, and an electro-absorption (EA) modulator control loop in the DWDM device to actively control the bias current during a change of operating conditions in the DWDM device. Generally, the optimized APC loop and the controlled laser bias current actively control (i) timing and (ii) overshoot of an output wavelength of the laser during a transient process in the DWDM device. In some embodiments, the DWDM device includes an optical transmitter, and in one implementation, the DWDM device is an optical transceiver.

The apparatus generally relates to a DWDM device, comprising a laser; an APC loop, configured to control a power to the laser and to reduce, prevent or eliminate overshoot during power-up of the laser or the DWDM device; a TEC loop, configured to control one or more thermoelectric characteristics of the laser; and an EA modulator control loop, configured to control an EA modulation of the laser. The APC loop generally includes a bias current control circuit configured to provide a bias current to the laser; an overshoot control circuit configured to control the bias current, and thereby reduce, prevent or eliminate an overshoot in an output wavelength of the laser; the laser; a laser monitoring circuit configured to monitor a power, wavelength and/or intensity of the laser; and/or a processor unit configured to set an initial state of the bias current control circuit.

These and other aspects of the present invention will become readily apparent from the detailed description of various embodiments below.

DETAILED DESCRIPTION

Figure 1:
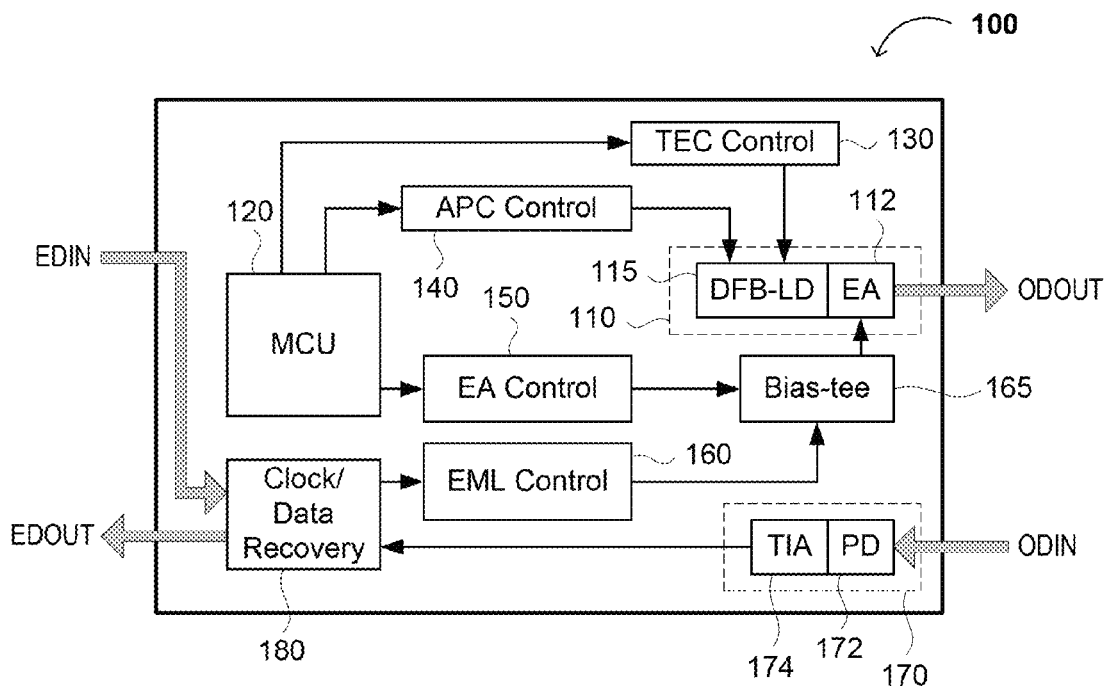
FIG. 1 is a diagram showing a conventional DWDM optical module.
Figure 2:
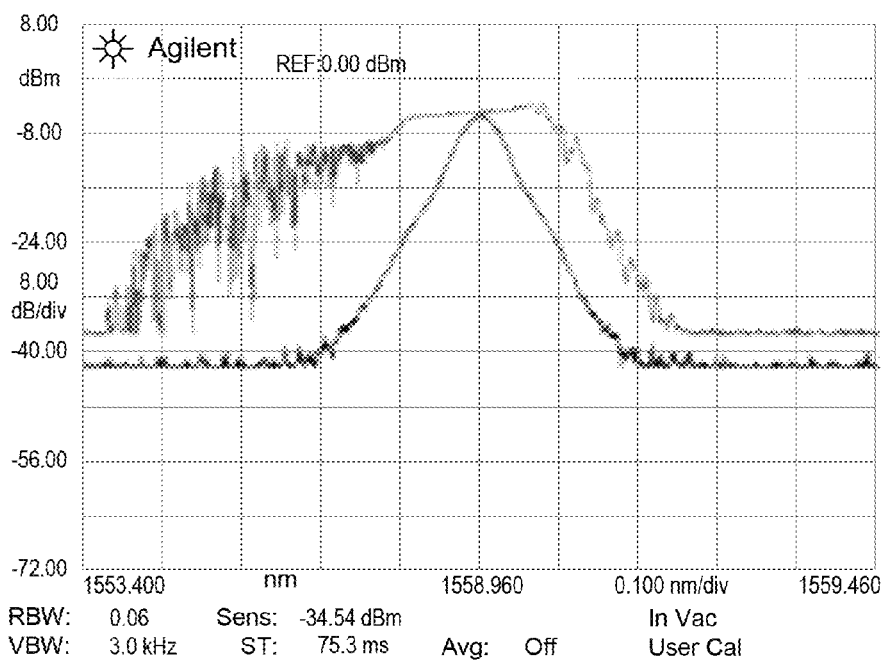
FIG. 2 is a graph showing the power as a function of wavelength for a transient signal in a conventional DWDM optical module.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

This specification (including the claims, abstract and drawings), in any of its characteristics, unless specifically described, may include other equivalent or substitute features, elements, or characteristics with similar structures, functions, results and/or objectives. That is, unless specifically described, every feature described herein includes equivalent or similar features. The invention, in its various aspects, will be explained in greater detail below with regard to exemplary embodiments.

The present method, control algorithm and circuitry can effectively control the laser turn-on transient process, through (1) employing software and hardware to control timing and overshoot, (2) optimizing APC (Automatic Power Control) and TEC (Thermoelectric Control) algorithms, and (3) optimizing an electro-absorption (EA) modulator control algorithm. In the present invention, a low cost method is demonstrated for achieving fast and stable turn-on (or start-up) of an optical transceiver at a particular wavelength through combining software and hardware and optimizing APC, EA and TEC control algorithms, as well as hardware/circuit control. Through using the disclosed method and circuit, each DWDM channel at start-up or turn-on (e.g., each wavelength over which data is transmitted on a fiber) is controlled stably at a desired wavelength or within a desired wavelength range, and with fast turn-on time. Thus, optical crosstalk between DWDM channels is reduced or eliminated by dynamically configuring the turn-on/-off or switching of each DWDM channel among a plurality of different DWDM channels.

Based on semiconductor laser characteristics, a change in the bias current or temperature can lead to a change in the wavelength of light output by the laser. For example, in an EML laser using a distribution grating laser diode (DFB-LD), a 1 mA bias current change leads to 0.008 nm wavelength change, and a 1° C. temperature change can cause a 0.1 nm wavelength change. During power-on (start-up) or a re-start of the laser, the laser bias current may produce a transient overshoot, and the steady-state current to the laser may increase (e.g., relative to the target current), thereby introducing a risk that the laser output wavelength may change. At the same time, because the laser temperature changes and the TEC circuit makes adjustments after the temperature change, the cooling or heating can dramatically change wavelength. In the present disclosure, a low-cost method, circuit and software are proposed. Testing has shown that the present method and circuit can decrease variations in the output wavelength by 3~5× during power-on, thereby providing a fast and stable power-on process for DWDM applications (e.g., dense wave optical transceivers, modules and [sub]systems).

To decrease and/or suppress significant changes in the laser output wavelength during a transient process (such as during power-on or restart), the present invention provides novel control circuitry to control the timing sequence and (bias) overshoot, especially optimized APC and TEC control circuitry and algorithm(s) and one or more electroabsorption (EA) modulator operation point(s), thereby controlling conditions that may cause a transient change in the output wavelength. The control circuitry and method meets various standards and/or requirements, such as requirements of XFP MSA for 2 ms startup time, and ITU standards for DWDM wavelength spacing, etc.

Optimization of operational processes and the underlying software algorithm(s) is also an important step. The present disclosure covers the thorough optimization of APC, EA and TEC control hardware and algorithms. Together, the combination of hardware/circuit and software optimization achieves fast wavelength stability. Further, the use of an APC software control algorithm, combined with the hardware/circuitry described herein, can optimize the speed and stability of the laser output wavelength, and achieve or approach optimal performance.

DWDM optical transceivers in a in DWDM optical module set a laser bias current using a bias current ("laser overshoot") control circuit, and optimize the foregoing APC and TEC control algorithm(s) and the aforementioned EA modulator control algorithm. The present optical transceiver has been implemented with active/automatic overshoot control and wavelength drift pre-compensation, in both circuitry and firmware.

Electrical circuitry in a DWDM optical module suitable for the present invention includes (i) a processor (e.g., a microprocessor, microcontroller or digital signal processor [DSP]), and (ii) the laser bias current control circuit. Other circuitry may include (a) a TEC control circuit and loop, in electrical communication with the processor and the laser (e.g., an EML or EML TOSA), (b) an APC control circuit and loop, in electrical communication with the processor and the laser, and (c) an EA modulator control circuit and loop, in electrical communication with the processor and the bias current control circuit. In each case, the TEC control loop, the APC control loop, and/or the EA modulator control loop may further comprise a feedback path from the laser (e.g., the DFB laser diode) to the processor. This feedback path generally comprises a monitor circuit configured to monitor a power, wavelength and/or intensity of the laser output and provide information relating to the power, wavelength and/or intensity to the processor.

Figure 3:
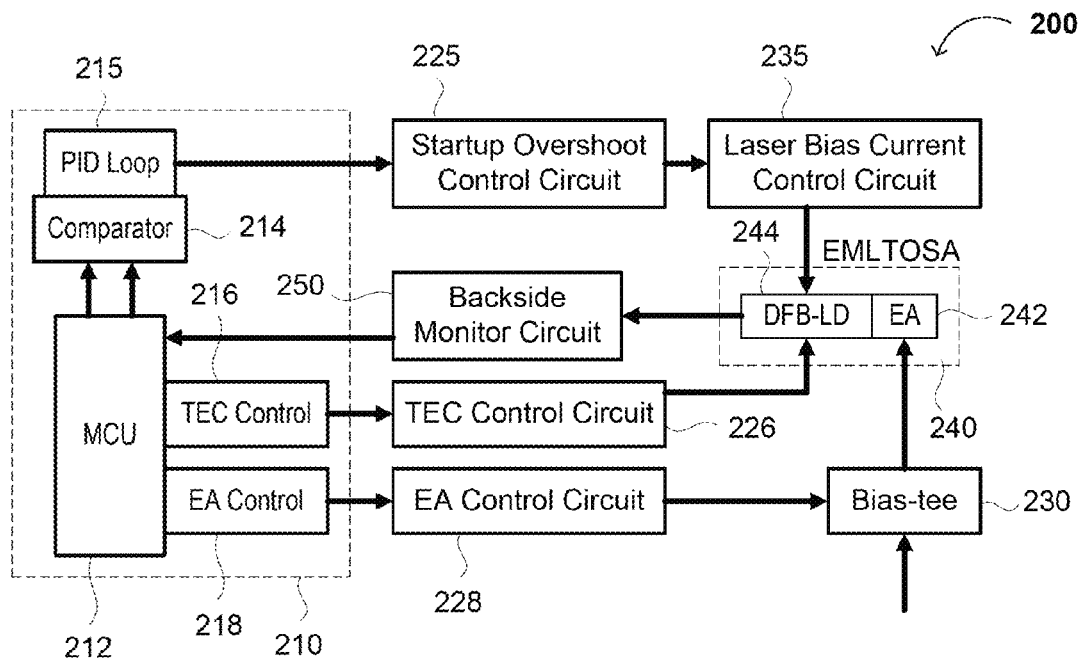
FIG. 3 is a diagram showing an exemplary embodiment of the present transmitter circuitry for an optical transceiver.

FIG. 3 shows an embodiment of a transmitter portion 200 of an optical transceiver, including an embodiment of the present laser bias current and start-up control circuit. The optical transmitter includes processor and control block 210, startup overshoot control circuit 225, TEC control circuit 226, EA control circuit 228, laser bias current control circuit 235, EA modulation bias circuit 230, optical output unit 240, and backside monitor circuit 250. The microprocessor and control block 210 generally comprises microcontroller unit 212, comparator 214, PID loop 215, TEC control block 216 and EA control block 218. The optical output unit 240 generally comprises electroabsorption circuit 242 and laser diode 244.

At startup, the microcontroller unit 212 generally provides information relating to an initial state of the transmitter to the comparator 214, the TEC control circuit 226, and the EA control circuit 228. At startup, the comparator 214 generally passes the information relating to the initial state to the Proportional-Integral-Derivative (PID) loop 215, which outputs a signal representing the initial state of the laser bias current control circuit 235 to the startup overshoot control circuit 225. If the signal representing the initial state of the laser bias current control circuit 235 is too high (an "overshoot" condition), which could cause a change in the wavelength of the laser output and result in crosstalk, the startup overshoot control circuit 225 suppresses the overshoot. The maximum value of the signal representing the initial state of the laser bias current control circuit 235 is determined by a setting (stored in a memory in the processor and control block 210 or in a separate memory, such as an EPROM) corresponding to an allowable maximum overshoot, since some appropriate amount of overshoot can cause the laser 244 to turn on faster. The laser bias current control circuit 235 then provides a current to the laser 244 that causes the laser 244 to emit light or light pulses at a target or predetermined wavelength, without an amount of overshoot that causes crosstalk. The backside monitor circuit 250 then monitors the power, wavelength and/or intensity of the light emitted from the laser 244 and provides a feedback signal to the microcontroller unit 212 to close the APC control feedback loop. The TEC control loop (generally comprising TEC control block 216, TEC control circuit 226, laser 244 and monitor circuit 250) and the EA control loop (generally comprising EA control block 218, EA control circuit 228, bias-tee circuit 230, laser output block 240 and monitor circuit 250) are generally configured in a conventional arrangement, but may be optimized as described herein.

Figure 4:
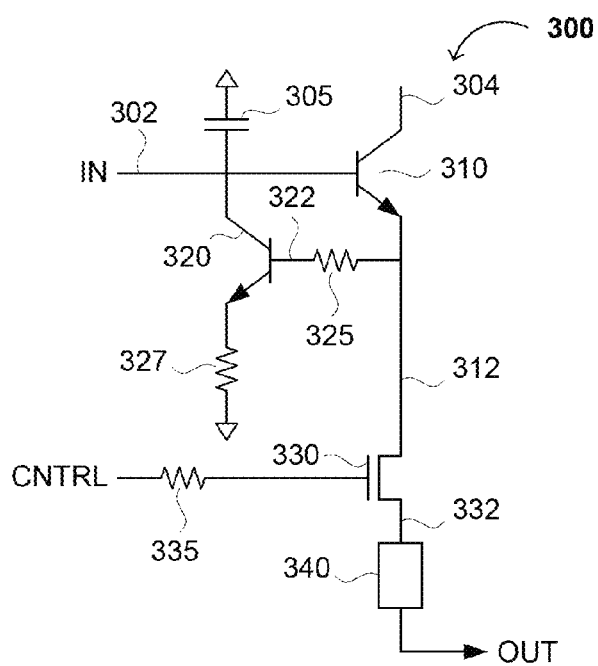
FIG. 4 is a diagram of an exemplary circuit, suitable for use in the laser bias current and start-up overshoot control circuitry of FIG. 3.

FIG. 4 shows an exemplary circuit 300 configured to perform the functions of the startup overshoot control circuit 225 and laser bias current control circuit 235 of FIG. 3. Circuit 300 generally comprises a first transistor 310, an overshoot control transistor 320, an optional switch 330, and an optional resistance block 340. The first transistor 310 provides a bias current for the laser (e.g., laser 244 in FIG. 3) in response to the signal from the PID loop 215 at node 302. The signal at node 302 may be filtered or smoothed by capacitor 305 connected thereto. A second input terminal 304 of the first transistor 310 receives an input current from a standard or conventional current source. Alternatively, the first transistor 310 may receive the input current from a power source (e.g., Vcc) and/or laser current monitoring circuitry (not shown). In the embodiment shown in FIG. 4, the first transistor 310 is an NPN bipolar transistor, but in other embodiments, the first transistor 310 can be an N-channel MOS transistor. First transistor 310 outputs a bias current at node 312.

The overshoot control transistor 320 receives a signal 322 at its control terminal that is related to the bias current at node 312. In one embodiment, a resistor 325 is between the node 312 and the control terminal of overshoot control transistor 320, and the signal 322 at the control terminal of overshoot control transistor 320 is a voltage. The signal 322 changes the value of the input signal at node 302 when it is above a value corresponding to an overshoot condition. During the overshoot condition, the overshoot control transistor 320 turns on and sinks or sources a current sufficient to change the value of the signal at node 302 and control the bias current provided by the first transistor 310. In this way, an overshoot of the wavelength of light emitted by the laser can be avoided, thereby preventing crosstalk during a transient process such as start-up or turn-on. In the embodiment shown in FIG. 4, the overshoot control transistor 320 is an NPN bipolar transistor, but in other embodiments, the overshoot control transistor 320 can be an N-channel MOS transistor. In one embodiment, a resistor 327 is between the overshoot control transistor 320 and a power rail (e.g., ground).

The bias current at node 312 may be passed through switch 330, which receives a control signal that generally keeps the switch 330 on during start-up and normal operation. In one embodiment, the control signal is passed through a resistor 335 before being applied to Switch 330 can be turned off during a fast turn-off mode, in which bias current to the laser is cut off quickly to prevent the laser from emitting light and/or stop transmission of optical data. The bias current may then be passed through the resistance block 340, which generally comprises one or more resistors or resistively-configured devices (such as a transistor having a control terminal receiving a bias voltage, or one or more diodes configured to function as a resistive device). In the case where two or more resistive devices are present in the resistance block 340, the resistive devices may be arranged in parallel, in series, or both. In one embodiment, the resistance block 340 comprises an array of resistive devices configured to provide a programmable resistance. The output from the resistance block 340 may be applied to the laser (e.g., laser 244 in FIG. 3). Thus, in one embodiment, the output of the resistance block 340 in FIG. 4 can be the output of the laser bias current control circuit 235 of FIG. 3.

Figure 5:
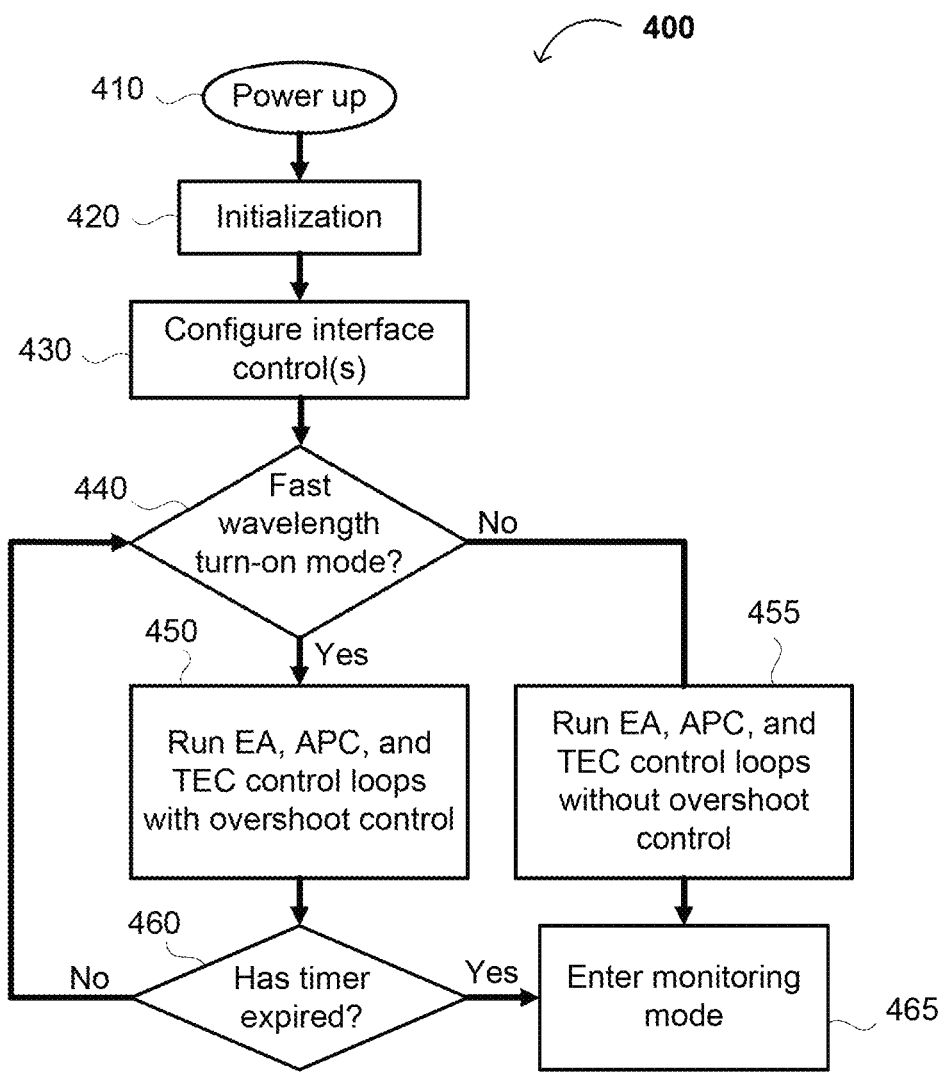
FIG. 5 is a flow chart generally showing a method, algorithm or software for controlling the start up or tuning process for the present optical transceiver.

FIG. 5 is a flow chart 400 of an exemplary method of generating an output signal in a DWDM device and controlling an overshoot condition during power-up of the laser or the DWDM device. First, power is applied to the DWDM device (or a power-up mode is entered) at 410. Next, the DWDM device is initialized at 420 (e.g., by loading initial value of control signals into the microcontroller 212 in FIG.

3), and one or more of the interface controls (e.g., between the transceiver and the host, and/or between the transceiver and an electrical component connected thereto) are configured at 430. Next, it is determined whether to enter a fast wavelength turn-on mode at 440. Generally, the DWDM device will enter fast wavelength turn-on mode following power-up. However, in one embodiment, if the DWDM device is already in a thermal state associated with normal operations (e.g., after a reboot), then the DWDM device may not enter fast wavelength turn-on mode following power-up.

If the DWDM device will enter the fast wavelength turn-on mode, then at 450, the DWDM device runs the EA, APC and TEC control loops. In the APC control loop performed at 450, overshoot control (which may be automatic) is performed as described herein. Also, at 450, a timer is started to provide the DWDM device with digital or step control to start and stabilize the output power, output wavelength and/or temperature of the DWDM device before exiting the fast wavelength turn-on mode. The digital timing sequence control of the EA, APC and TEC loops maintains the optical output power and wavelength during fast changes of operating conditions, for example: (1) during power down status (e.g., a power down operation), the EA bias voltage is adjusted to a maximum value, APC is set to a minimum value, and TEC is changed from a tuned setting with the pre-compensation offset; and/or (2) during power up processing (e.g., a power up operation), the APC setting is adjusted using a step-wise increase, the TEC is adjusted to a tuned setting, and the EA is adjusted to a tuned setting. Thus, at 460, when the timer expires, the DWDM device enters the monitoring mode at 465, in which one or more characteristics or properties of the laser output (e.g., power, wavelength or intensity) are monitored. Otherwise, if the timer has not expired at 460, the DWDM device stays in the fast wavelength turn-on mode (440), and the EA, APC and TEC control loops are run (generally with overshoot control as described herein). However, if the DWDM device does not enter the fast wavelength turn-on mode, the EA, APC and TEC control loops are run at 455, but overshoot control is generally turned off, and the DWDM device enters the monitoring mode at 465.

The present disclosure also includes algorithms, computer program(s), computer-readable media, and/or software, implementable and/or executable in a general purpose computer or workstation equipped with a conventional digital signal processor, configured to perform one or more of the methods and/or one or more operations of the hardware disclosed herein. Thus, a further aspect of the method(s) relate to algorithms and/or software that implement a method for controlling overshoot of a laser in a DWDM device. For example, the computer program or computer-readable medium generally contain a set of instructions which, when executed by an appropriate processing device (e.g., a signal processing device, such as a microcontroller, microprocessor or DSP device), are configured to perform the method(s) and/or algorithm(s) described herein.

For example, the computer program may be on any kind of readable or tangible medium, and the computer-readable medium may comprise any medium (including non-transitory media) that can be read by a processing device configured to read the medium and execute code stored thereon or therein, such as a floppy disk, CD-ROM, magnetic tape, hard disk drive or volatile or nonvolatile (e.g., flash) memory. Such code may comprise object code, source code and/or binary code. The code for implementing the present method(s) can comprise (but is not limited to) source code or object code, and can be digital. The code and/or instructions are generally configured for processing by a conventional digital data processor (e.g., a microprocessor, microcontroller, or logic circuit such as a programmable gate array, programmable logic circuit/device or application-specific [integrated] circuit).

Figure 6:
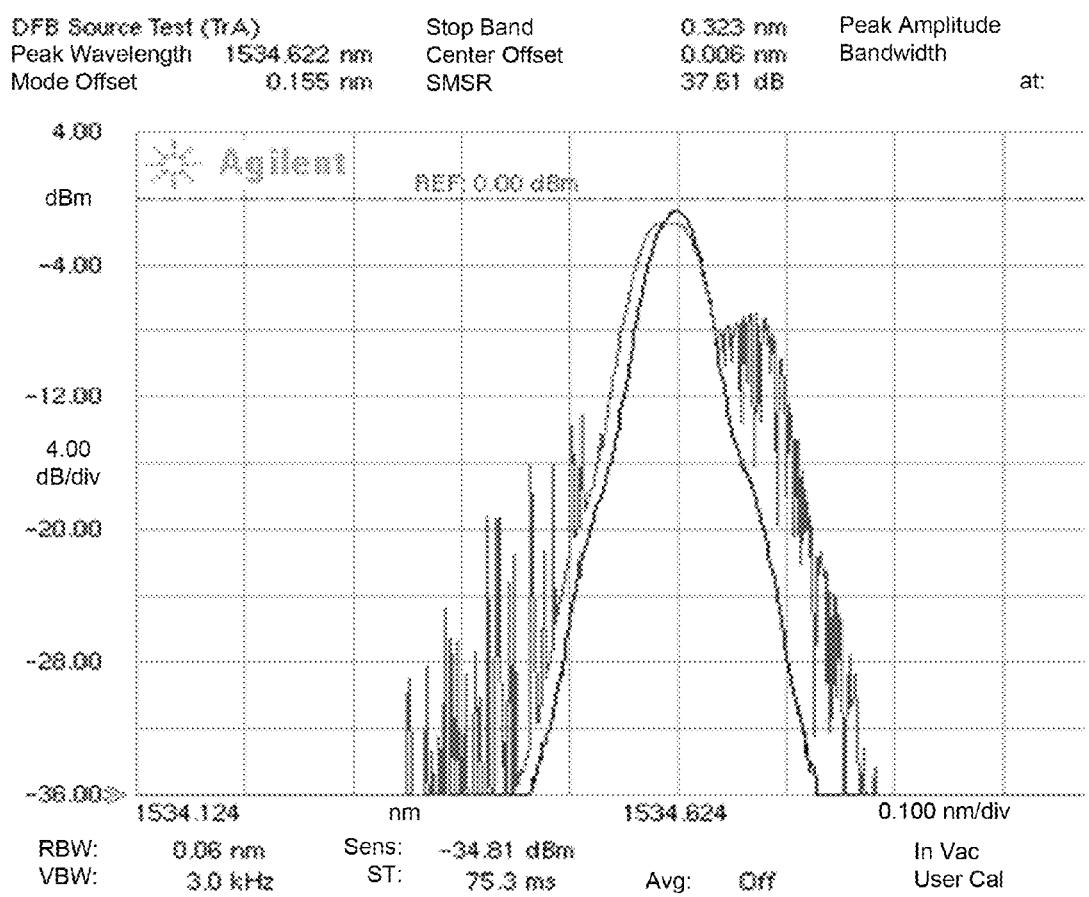
FIG. 6 is a graph showing the power as a function of wavelength for a transient signal in an exemplary circuit representative of the present invention.
Figure 7:
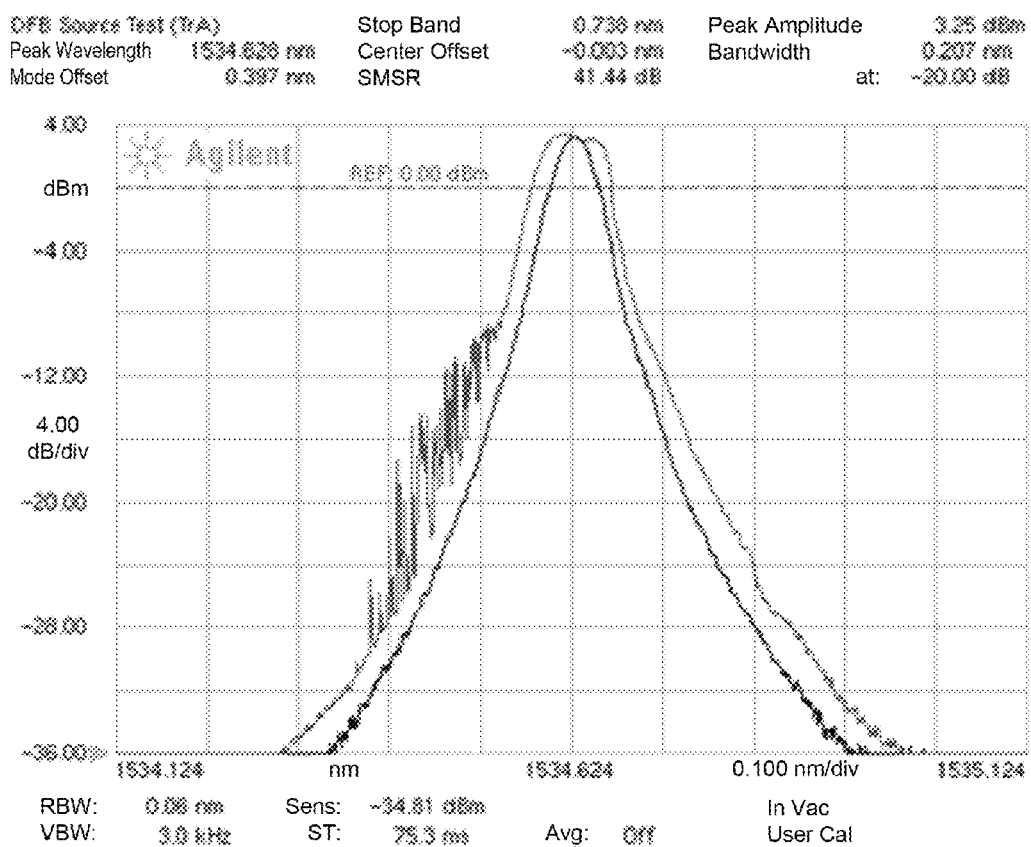
FIG. 7 is another graph showing the power as a function of wavelength for a transient signal in an exemplary combination of hardware and software representative of the present invention.

FIGS. 6 and 7 show the results of testing embodiments of the present methods, the present hardware and the present combination of software and hardware. The results in FIGS. 6 and 7 respectively demonstrate that the present invention provides a very small variation in laser output wavelength (as determined by output power) during power-up, so that there is substantially no wavelength drift, and the elimination of crosstalk between adjacent channels in a dense wave (e.g., DWDM) optical (sub)system can be ensured.

The method used for maintaining a stable wavelength during a period of fast changes in operating conditions of a DWDM optical module/transceiver may be characterized by the following:

a) A DWDM optical transceiver/module can use the present method, software and circuit to automatically control and adjust overshoot;
b) The present circuit can be built into an existing laser bias circuit design;
c) Optimized APC, TEC and EA modulator control loops can use a digital timing sequence and pre-compensation functions and values to implement improved control; and
d) The combination of automatic control circuitry and software (e.g., the APC/TEC/EA control loops) can dynamically check, control or compensate wavelength drift during normal operation.

The above detailed description is mentioned only as an example of the invention, and is not intended to restrict the invention, where it is within the spirit and principle(s) of the invention to include any modification, replacement, improvement, and/or equivalent in the scope of protection. Thus, the characteristics disclosed in this specification and any additional claims, Abstract and drawings, unless specifically described, may be interchanged, substituted or supplemented with other equivalent or similar characteristics and/or features in accordance with the aims or objectives of the invention. That is, unless specifically described, every feature in any example herein may be just a series of equivalent or similar features.

CONCLUSION/SUMMARY

Thus, the invention disclosed in this application provides a method, circuitry, software and firmware to achieve fast and stable wavelength turn-on in an optical transmitter through controlling the timing sequence and preventing overshoot, and optionally by pre-compensating a TEC setting and/or EA modulator operation point. As demonstrated by the test results disclosed herein, the invention meets different standards and/or requirements for DWDM optical transmitters/transceivers, which include XFP MSA specifications for fast initialization time, and for the ITU DWDM grid.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of generating an output signal in a dense wavelength division multiplexing (DWDM) device, comprising:
providing a bias current to a laser in the DWDM device;
comparing an initial state of a transmitter including the laser to a maximum overshoot value;
reducing the bias current to the laser to prevent or eliminate an overshoot condition of the bias current when the initial state exceeds the maximum overshoot value during power-up of the laser or the DWDM device, so as to prevent a change in output wavelength of the laser that would result in crosstalk; and
optimizing an automatic power control (APC) loop, a thermoelectric control (TEC) loop, and an electro-absorption (EA) modulator control loop in the DWDM device to actively control the bias current during a change of operating conditions in the DWDM device.

2. A dense wavelength division multiplexing (DWDM) device, comprising:
a laser;
an automatic power control (APC) loop, comprising a comparator, an overshoot control circuit, and a bias current control circuit, the APC loop configured to compare an initial state of a transmitter including the laser to a maximum overshoot value, and reduce a bias current to the laser to prevent or eliminate overshoot of the bias current when the initial state exceeds the maximum overshoot value during power-up of the laser or the DWDM device, so as to prevent a change in output wavelength of the laser that would result in crosstalk;
a thermoelectric control (TEC) loop, configured to control one or more thermoelectric characteristics of the laser; and
an electro-absorption (EA) modulator control loop, configured to control an EA modulation of the laser.

3. The method of claim 1, wherein the DWDM device includes an optical transmitter.

4. The method of claim 3, wherein the DWDM device is an optical transceiver.

5. The method of claim 4, wherein the DWDM optical transceiver sets an automatic, adjusted laser bias current control circuit with a predetermined setting, and optimizes the APC and TEC control loops and an operation point of the EA modulator control loop.

6. The method of claim 5, wherein the DWDM optical transceiver includes a processor and the bias current control circuit, and the processor and the bias current control circuit (i) actively adjust the bias current to prevent or eliminate the overshoot of the bias current and pre-compensate for any expected change in the output wavelength of the laser.

7. The method of claim 1, wherein optimizing said APC loop, said TEC loop, and said EA modulator control loop includes:
applying power to and initializing the DWDM device;
actively monitoring and controlling the output wavelength and a peak power of the laser within a predetermined range; and
incrementing or decrementing a bias voltage to the EA modulator, pre-offsetting a setting in the TEC loop to compensate for any drift in the output wavelength of the laser, and/or automatically adjusting a setting in the APC loop to control the overshoot in the output wavelength of the laser.

8. The method of claim 1, further comprising configuring a control interface of said APC loop, said TEC loop, and said EA modulator control loop; and either
if the DWDM device is undergoing a transient process, applying EA, APC, and TEC control to the laser, and after a predetermined length of time, entering a monitor mode; or
if the DWDM device is not in a quick change of operating conditions mode, then directly entering the monitoring mode.

9. The method of claim 1, wherein the DWDM device sets the bias current in a bias current control circuit, and optimizes APC, TEC and EA modulator control algorithms.

10. A dense wavelength division multiplexing (DWDM) device, comprising:
a laser;
an automatic power control (APC) loop, comprising a comparator, an overshoot control circuit, and a bias current control circuit, the APC loop configured to compare an initial state of a transmitter including the laser to a maximum overshoot value, and reduce a bias current to the laser to prevent or eliminate overshoot of the bias current or an output wavelength of the laser when the initial state exceeds the maximum overshoot value during power-up of the laser or the DWDM device;
a thermoelectric control (TEC) loop, configured to control one or more thermoelectric characteristics of the laser; and
an electro-absorption (EA) modulator control loop, configured to control an EA modulation of the laser.

11. The DWDM device of claim 10, wherein:
the bias current control circuit provides the bias current to the laser; and
the overshoot control circuit reduces the bias current when the initial state exceeds the maximum overshoot value, and thereby prevents or eliminates the overshoot in the output wavelength of the laser.

12. The DWDM device of claim 11, wherein the APC loop further includes:
the laser;
a laser monitoring circuit configured to monitor a power, wavelength and/or intensity of the laser; and
a processor unit configured to set an initial state of the bias current control circuit.

13. The DWDM device of claim 12, wherein the processor unit includes a PID loop providing setting information to the overshoot control circuit, a TEC control block providing setting information to the TEC loop, and an EA control block providing setting information to the EA loop.

14. The DWDM device of claim 12, wherein the processor unit includes a microcontroller configured to control the APC, TEC and EA modulator control loops.

15. The DWDM device of claim 12, wherein the TEC loop includes:
a TEC control circuit configured to provide a signal to the laser configured to maintain or adjust one or more thermoelectric characteristics or properties of the laser;
the laser;
the laser monitoring circuit; and
the processor unit.

16. The DWDM device of claim 12, wherein the EA loop includes:
an EA control circuit configured to provide a signal to the laser configured to maintain or adjust an EA modulation of the laser;
the laser;
the laser monitoring circuit; and
the processor unit.

17. The DWDM device of claim 16, wherein the EA loop further includes a bias-tee circuit configured to receive an output of the EA control circuit and provide an EA modulation signal to the laser.

18. The DWDM device of claim 10, wherein the laser comprises a distribution grating laser diode.

19. The DWDM device of claim 10, wherein the laser further comprises an EA modulator configured to modulate an output of the laser.

* * * * *